(12) United States Patent
Tsuji

(10) Patent No.: US 12,328,888 B2
(45) Date of Patent: Jun. 10, 2025

(54) METHOD OF MANUFACTURING SEMICONDUCTOR DEVICE

(71) Applicant: SUMITOMO ELECTRIC INDUSTRIES, LTD., Osaka (JP)

(72) Inventor: Yukihiro Tsuji, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 494 days.

(21) Appl. No.: 18/047,402

(22) Filed: Oct. 18, 2022

(65) Prior Publication Data

US 2023/0238447 A1 Jul. 27, 2023

(30) Foreign Application Priority Data

Jan. 24, 2022 (JP) .................................. 2022-008880

(51) Int. Cl.
*H10D 30/01* (2025.01)
*H10D 62/13* (2025.01)
*H10D 64/01* (2025.01)

(52) U.S. Cl.
CPC ......... *H10D 30/015* (2025.01); *H10D 62/161* (2025.01); *H10D 64/01* (2025.01)

(58) Field of Classification Search
CPC .... H10D 30/015; H10D 62/161; H10D 64/01; H10D 30/4755; H10D 62/8503; H10D 62/149; H01L 21/0331; H01L 21/465
See application file for complete search history.

(56) References Cited

U.S. PATENT DOCUMENTS

| | | | |
|---|---|---|---|
| 9,515,161 B1 | 12/2016 | Shinohara et al. | |
| 2013/0049007 A1* | 2/2013 | Sasaki | H10D 30/4755 257/E29.072 |
| 2019/0214494 A1 | 7/2019 | Yamada et al. | |

FOREIGN PATENT DOCUMENTS

JP  2019-125600  7/2019

* cited by examiner

*Primary Examiner* — Mohammad A Rahman
(74) *Attorney, Agent, or Firm* — IPUSA, PLLC

(57) ABSTRACT

A method of manufacturing a semiconductor device includes: forming an electron transit layer; forming an electron supply layer; forming a protective film; forming a zinc oxide film; forming a sacrifice layer; forming a first opening and a second opening in the sacrifice layer and the zinc oxide film; forming a third opening connecting to the first opening and a fourth opening connecting to the second opening; forming, by acid treatment using a weakly acidic solution, a first gap in a first portion exposed to the first opening of the zinc oxide film, and a second gap in a second portion exposed to the second opening of the zinc oxide film; forming, after the acid treatment, a source region on a bottom surface of the third opening and a drain region on a bottom surface of the fourth opening; and removing the zinc oxide film.

10 Claims, 7 Drawing Sheets

METHOD OF MANUFACTURING SEMICONDUCTOR DEVICE

CROSS-REFERENCE TO RELATED APPLICATIONS

The present application is based upon and claims priority to Japanese Patent Application No. 2022-008880, filed on Jan. 24, 2022, the entire contents of which are incorporated herein by reference.

BACKGROUND OF THE INVENTION

1. Field of the Invention

The present disclosure relates to a method of manufacturing a semiconductor device.

2. Description of the Related Art

With respect to a high electron mobility transistor (HEMT), methods have been proposed for reducing contact resistance representing a total resistance component between source and drain electrodes and a two dimensional electron gas (2DEG) in Japanese Laid-Open Patent Publication No. 2019-125600 and U.S. Pat. No. 9,515,161, for example. In the method, an opening is formed in the electron supply layer and the electron transit layer, and a GaN ($n^+$GaN) layer containing a high concentration of n-type impurities is re-grown in the opening. Then, a source electrode and a drain electrode are formed on the $n^+$GaN layer (regrown layer).

When manufacturing a semiconductor device by a conventional method, it may be difficult to stabilize electrical characteristics.

SUMMARY OF THE INVENTION

According to the present disclosure, a method of manufacturing a semiconductor device includes: forming an electron transit layer above a substrate; forming an electron supply layer above the electron transit layer; forming a protective film above the electron transit layer; forming a zinc oxide film above the protective film; forming a sacrifice layer above the zinc oxide film; forming a first opening and a second opening in the sacrifice layer and the zinc oxide film; forming a third opening connecting to the first opening and a fourth opening connecting to the second opening in the protective film, the electron supply layer, and the electron transit layer; forming, by acid treatment using a weakly acidic solution, a first gap in a first portion exposed to the first opening of the zinc oxide film, and a second gap in a second portion exposed to the second opening of the zinc oxide film; forming, after the acid treatment, a source region containing a first conductive impurity on a bottom surface of the third opening and a drain region containing the first conductive impurity on a bottom surface of the fourth opening; and removing the zinc oxide film after forming the source region and the drain region.

Other objects and further features of the present disclosure will be apparent from the following detailed description when read in conjunction with the accompanying drawings.

DESCRIPTION OF THE EMBODIMENTS

Description of Embodiments of Present Disclosure

Figure 1:
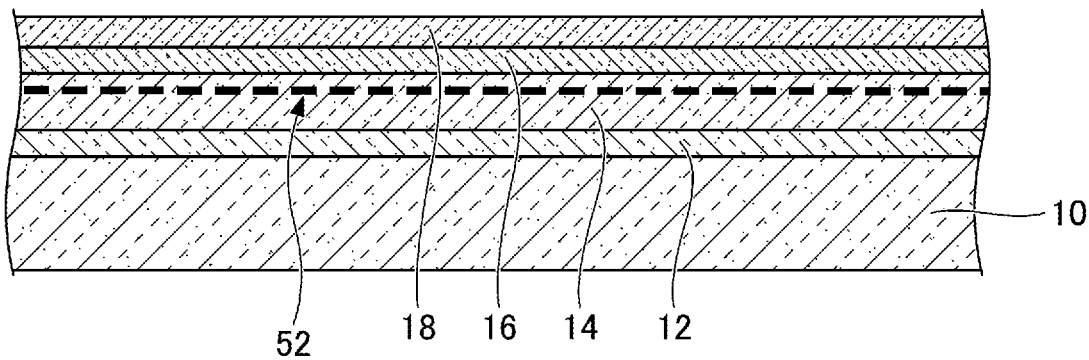
FIG. 1 is a cross-sectional view (first view) illustrating a method of manufacturing a semiconductor device according to a first embodiment.

First, the embodiments of the present disclosure are listed and described.

[1] According to one embodiment of the present disclosure, a method of manufacturing a semiconductor device includes: forming an electron transit layer above a substrate; forming an electron supply layer above the electron transit layer; forming a protective film above the electron transit layer; forming a zinc oxide film above the protective film; forming a sacrifice layer above the zinc oxide film; forming a first opening and a second opening in the sacrifice layer and the zinc oxide film; forming a third opening connecting to the first opening and a fourth opening connecting to the second opening in the protective film, the electron supply layer, and the electron transit layer; forming, by acid treatment using a weakly acidic solution, a first gap in a first portion exposed to the first opening of the zinc oxide film, and a second gap in a second portion exposed to the second opening of the zinc oxide film; forming, after the acid treatment, a source region containing a first conductive impurity on a bottom surface of the third opening and a drain region containing the first conductive impurity on a bottom surface of the fourth opening; and removing the zinc oxide film after forming the source region and the drain region.

According to [1], because the source region and the drain region are formed separately from the electron transit layer and the electron supply layer, the contact resistance can be reduced. In addition, because the weakly acidic solution is used for the acid treatment, it is easy to control the sizes of the first gap and the second gap. Therefore, the source region and the drain region can be formed with high accuracy, and the stability of electrical characteristics can be improved.

[2] In the method of [1], pH of the weakly acidic solution may be 3.0 or more and less than 7.0. When the pH of the weakly acidic solution is too low, the sizes of the first gap 34 and the second gap 44 may be difficult to control.

[3] In the method of [1], pH of the weakly acidic solution may be 6.86. In this case, particularly excellent stability of the solvency for the ZnO film of the weakly acidic solution can be obtained.

[4] In the methods of [1] to [3], the weakly acidic solution may contain phosphoric acid. In this case, even when etching of the ZnO film progresses, the pH does not easily change.

[5] In the methods of [1] to [4], forming the third opening and the fourth opening may be performed before the acid treatment. In this case, the formation of the first opening and the second opening and the formation of the third opening and the fourth opening can be performed continuously in one processing chamber.

[6] In the methods of [1] to [4], the acid treatment may be performed before forming the third opening and the fourth opening. In this case, because the electron supply layer and the electron transit layer are not exposed to the weakly acidic solution, it is possible to prevent adhesion of substances contained in the weakly acidic solution to the electron supply layer and the electron transit layer.

[7] In the method of [6], the weakly acidic solution may contain sodium hydroxide. In this case, it is easy to adjust the pH of the weakly acidic solution.

[8] In the methods of [1] to [7], a silicon nitride film may be formed as the protective film. In this case, it is easy to secure a large etching selectivity between the zinc oxide film and the protective film.

[9] In the methods of [1] to [8], an aluminum oxide film or a silicon nitride film may be formed as the sacrifice layer. In this case, it is easy to secure a large etching selectivity between the zinc oxide film and the sacrifice layer.

[10] In the methods of [1] to [9], a concentration of the first conductive impurity in each of the source region and the drain region may be $5\times10^{18}$ cm$^{-3}$ or more and $2\times10^{19}$ cm$^{-3}$ or less. In this case, it is easy to reduce the contact resistance.

Details of Embodiments of Present Disclosure

Embodiments of the present disclosure will be described in detail below, but the present disclosure is not limited thereto. In the present specification and drawings, components having substantially the same functional configuration may be given the same reference numerals to omit redundant description.

First Embodiment

A first embodiment will be described. The first embodiment relates to a method of manufacturing a semiconductor device including a GaN-HEMT whose main constituent material is a nitride semiconductor. FIGS. 1 to 10 are cross-sectional views illustrating a method of manufacturing a semiconductor device according to a first embodiment.

First, as illustrated in FIG. 1, a buffer layer 12, an electron transit layer 14, an electron supply layer 16, and a cap layer 18 are famed on a substrate 10. The substrate 10 is, for example, a silicon carbide (SiC) substrate having a (0001) plane orientation on the upper surface. The buffer layer 12 may be, for example, an AlN layer with a thickness of 5 nm or more and 100 nm or less. The electron transit layer 14 is, for example, an undoped GaN layer with a thickness of about 1000 nm. The electron supply layer 16 is, for example, an n-type AlGaN layer with a thickness of about 20 nm. The cap layer 18 is, for example, an n-type GaN layer with a thickness of about 5 nm. An n-type impurity used in the present embodiment is, for example, silicon (Si) or germanium (Ge). The stacking direction of the buffer layer 12, the electron transit layer 14, the electron supply layer 16, and the cap layer 18 is, for example, the [0001] direction. The buffer layer 12, the electron transit layer 14, the electron supply layer 16, and the cap layer 18 are famed, for example, by the MOCVD method. A 2DEG 52 is present near the upper surface of the electron transit layer 14.

Figure 2:
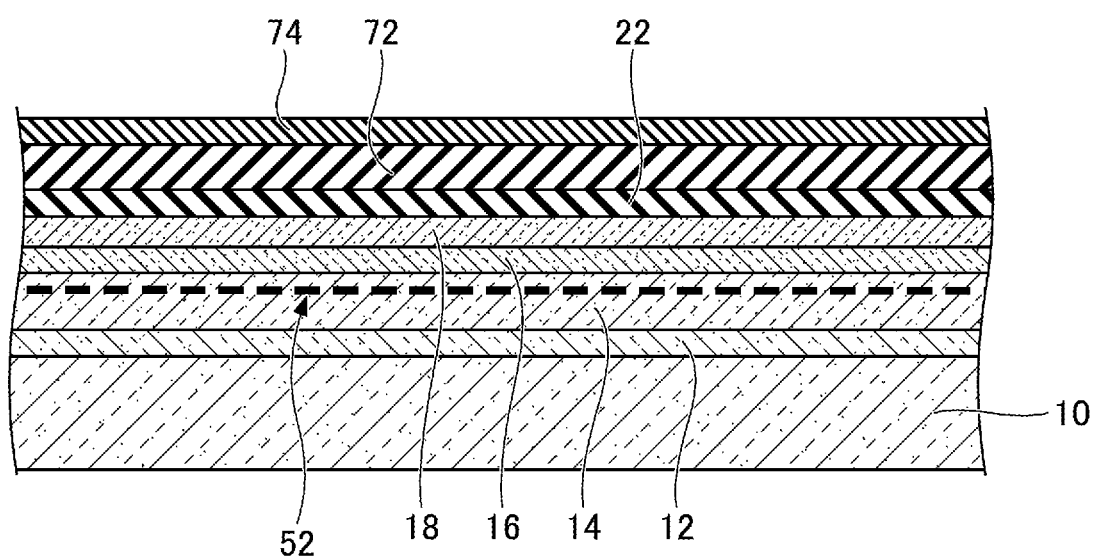
FIG. 2 is a cross-sectional view (second view) illustrating the method of manufacturing a semiconductor device according to the first embodiment.

Next, as illustrated in FIG. 2, a protective film 22 is formed on the cap layer 18. The protective film 22 is, for example, a silicon nitride (SiN) film. The silicon nitride film may be formed by, for example, a chemical vapor deposition (CVD) method. Next, a zinc oxide (ZnO) film 72 is formed on the protective film 22. The ZnO film 72 may be formed, for example, by a sputtering method or a sol-gel method. Next, a sacrifice layer 74 is formed on the ZnO film 72. The sacrifice layer 74 may be, for example, an aluminum oxide ($Al_2O_3$) film or a silicon nitride film. The aluminum oxide film may be foiled, for example, by an atomic layer deposition (ALD) method, and the silicon nitride film may be formed, for example, by a CVD method.

Figure 3:
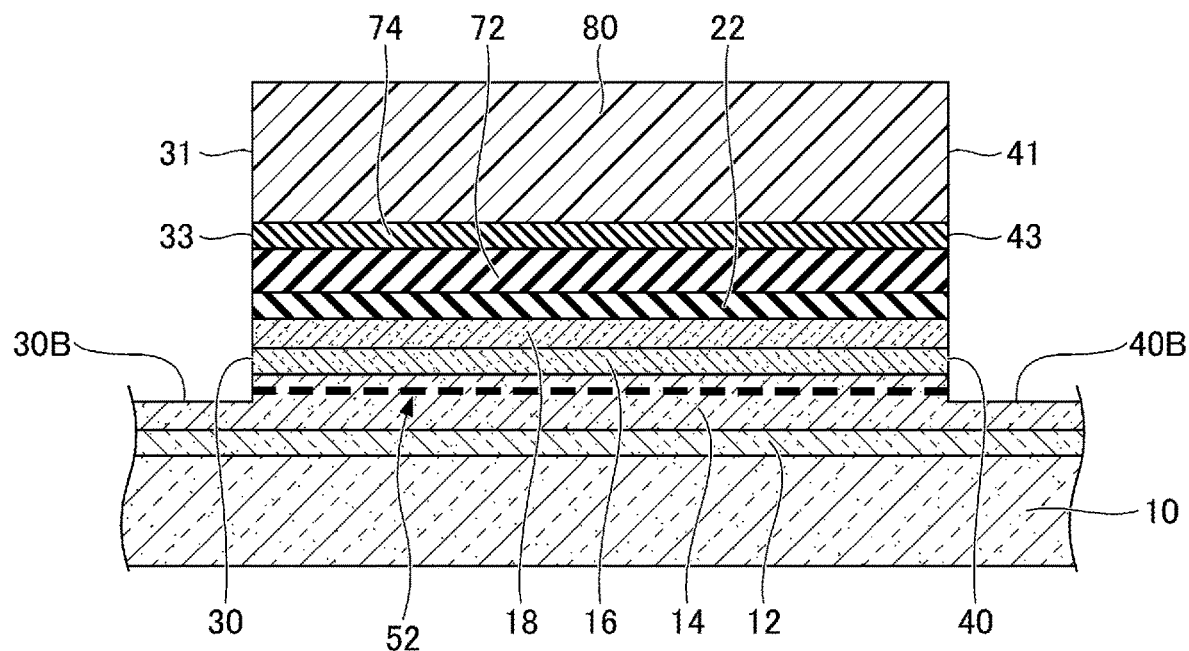
FIG. 3 is a cross-sectional view (third view) illustrating the method of manufacturing a semiconductor device according to the first embodiment.

Next, as illustrated in FIG. 3, a resist mask 80 is famed on the sacrifice layer 74. The resist mask 80 has an opening 31 for exposing a portion of the sacrifice layer 74 and an opening 41 for exposing another portion of the sacrifice layer 74. The distance between the opening 31 and the opening 41 is about 1 μm to 200 μm, for example. Then, a first opening 33 and a second opening 43 are formed in the sacrifice layer 74 and the ZnO film 72 by reactive ion etching (RIE). For etching the sacrifice layer 74, a reactive gas containing fluorine (F) may be used. For etching the ZnO film 72, a reactive gas containing chlorine (Cl) may be used.

Next, a third opening 30 and a fourth opening 40 are formed in the protective film 22, the cap layer 18, the electron supply layer 16, and the electron transit layer 14. The third opening 30 connects to the first opening 33, and the fourth opening 40 connects to the second opening 43. The third opening 30 has a bottom surface 30B and the fourth opening 40 has a bottom surface 40B. For etching the protective film 22, a reactive gas containing fluorine (F) may be used. For etching the cap layer 18, the electron supply layer 16, and the electron transit layer 14, a reactive gas containing chlorine (Cl) may be used.

Figure 4:
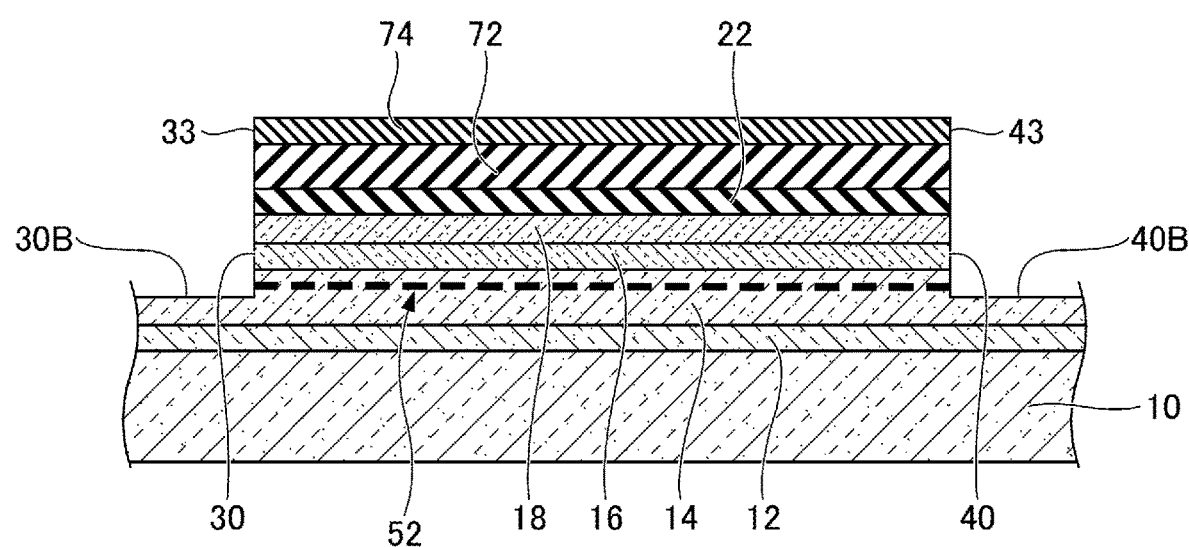
FIG. 4 is a cross-sectional view (fourth view) illustrating the method of manufacturing a semiconductor device according to the first embodiment.

Next, as illustrated in FIG. 4, the resist mask 80 is removed. The resist mask 80 may be removed using, for example, an organic solvent.

Figure 5:
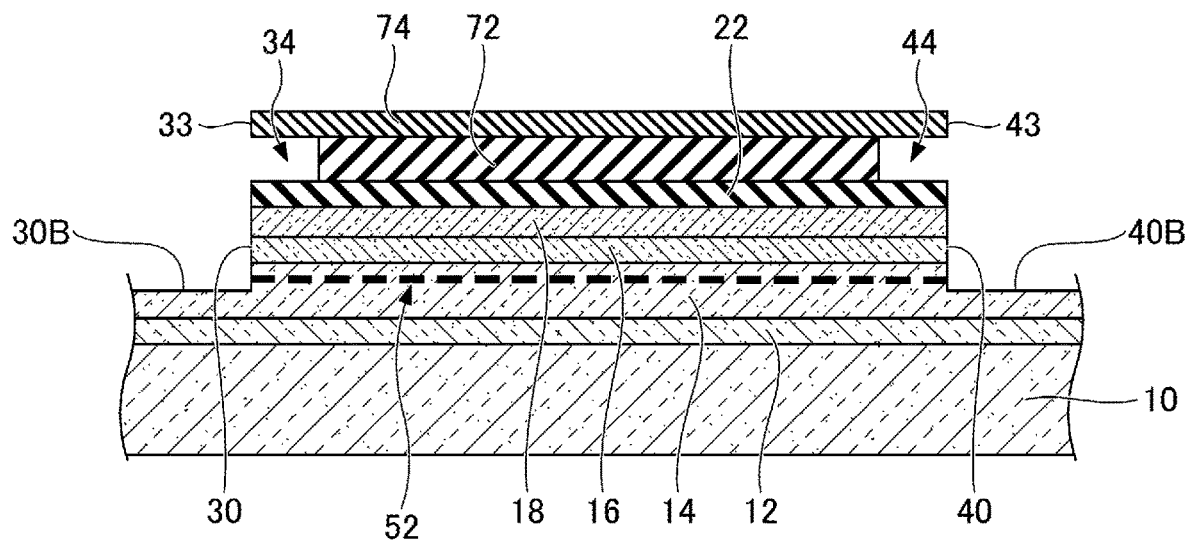
FIG. 5 is a cross-sectional view (fifth view) illustrating the method of manufacturing a semiconductor device according to the first embodiment.

Next, as illustrated in FIG. 5, by acid treatment using a weakly acidic solution, a first gap 34 is formed in a first portion exposed to the first opening 33 of the ZnO film 72, and a second gap 44 is formed in a second portion exposed to the second opening 43 of the ZnO film 72. The acid treatment is performed for a period of time such that each of the sizes of the first gap 34 and the second gap 44 in a direction where the first opening 33 and the second opening 43 are aligned is about 500 nm to 1000 nm. As the weakly acidic solution, a phosphate buffer solution having a pH of 6.86 is used, for example. The sacrifice layer 74 is formed with an overhang portion above the first gap 34 and an overhang portion above the second gap 44.

Figure 6:
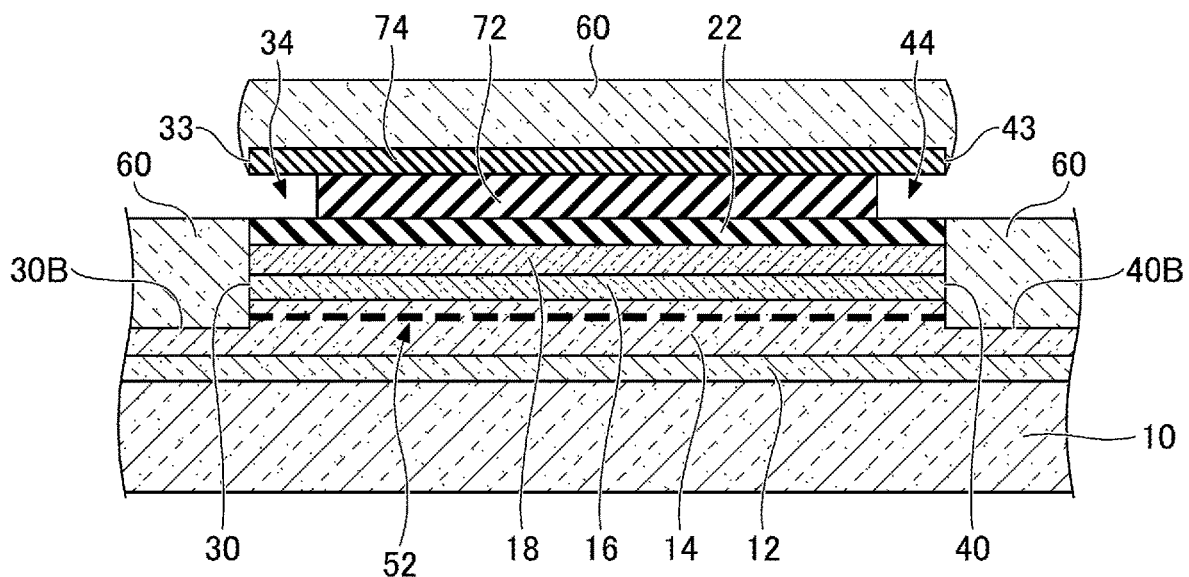
FIG. 6 is a cross-sectional view (sixth view) illustrating the method of manufacturing a semiconductor device according to the first embodiment.

Next, as illustrated in FIG. 6, a semiconductor layer 60 is formed within the third opening 30 and the fourth opening 40 by a metal organic chemical vapor deposition (MOCVD) method, a molecular beam epitaxy (MBE) method, or a sputtering method. The semiconductor layer 60 is famed on the bottom surface 30B of the third opening 30 and on the bottom surface 40B of the fourth opening 40. The semiconductor layer 60 grows in the third opening 30 and the fourth opening 40 while being lattice-matched with the electron transit layer 14. The semiconductor layer 60 is also famed on the sacrifice layer 74. The semiconductor layer 60 may also be formed on a side exposed to the first opening 33 and a side exposed to the second opening 43 of the sacrifice layer 74. The semiconductor layer 60 in contact with the sacrifice layer 74 may be, for example, polycrystalline. The semiconductor layer 60 is, for example, an n-type GaN layer. The semiconductor layer 60 contains, for example, the n-type impurity at a higher concentration than the electron supply layer 16. The concentration of the n-type impurity in the semiconductor layer 60 is, for example, $5 \times 10^{18}$ cm$^{-3}$ or more and $2 \times 10^{19}$ cm$^{-3}$ or less.

When forming the semiconductor layer 60, the temperature of the substrate 10 is maintained at a temperature at which the semiconductor layer 60 can grow. The semiconductor layer 60 is grown while being doped with the n-type impurity such as Si. When forming the semiconductor layer 60, until the formation of the semiconductor layer 60 is completed, the temperature of the substrate 10 is preferably maintained at or above a temperature at which the state in which the n-type impurity doped into the semiconductor layer 60 is dissolved in the semiconductor layer 60 is maintained. The temperature is, for example, about 700° C. By performing such temperature control, it is possible to prevent generation of a nitrogen compound of the n-type impurity in the semiconductor layer 60.

Figure 7:
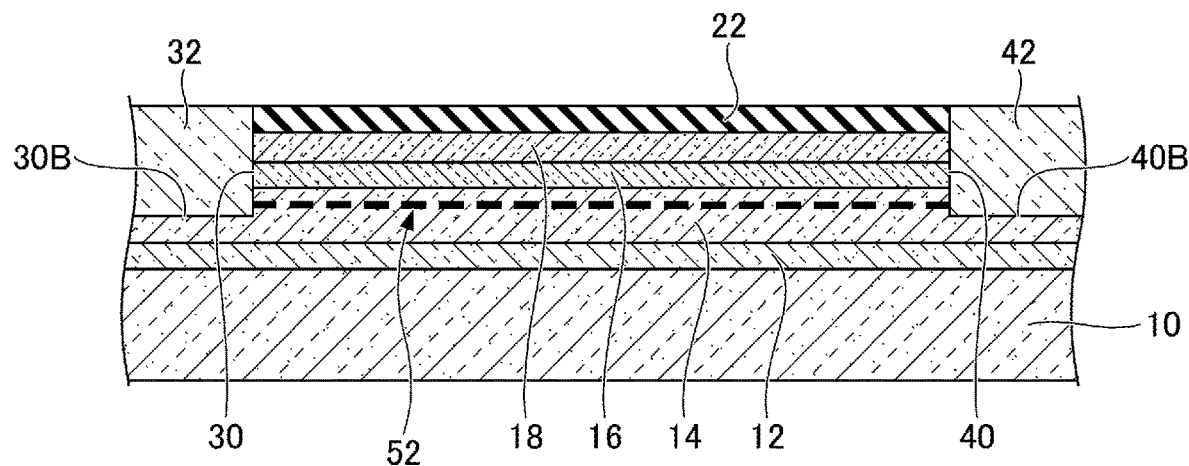
FIG. 7 is a cross-sectional view (seventh view) illustrating the method of manufacturing a semiconductor device according to the first embodiment.

Next, as illustrated in FIG. 7, the ZnO film 72 is removed. As the ZnO film 72 is removed, the sacrifice layer 74 is also removed, and as the sacrifice layer 74 is removed, the portion of the semiconductor layer 60 famed on the sacrifice layer 74 is also removed. In contrast, the portion within the third opening 30 and the portion within the fourth opening 40 of the semiconductor layer 60 are not removed. A source region 32 is provided in the third opening 30 and a drain region 42 is provided in the fourth opening 40. The ZnO film 72 can be removed using, for example, a strongly acidic solution. As the strongly acidic solution, for example, an aqueous hydrofluoric acid solution having a concentration of 5 wt % may be used. The strongly acidic solution has solvency 1000 times or more that of the weakly acidic solution used to form the first gap 34 and the second gap 44. Therefore, the ZnO film 72 can be removed in about 5 to 10 minutes.

Figure 8:
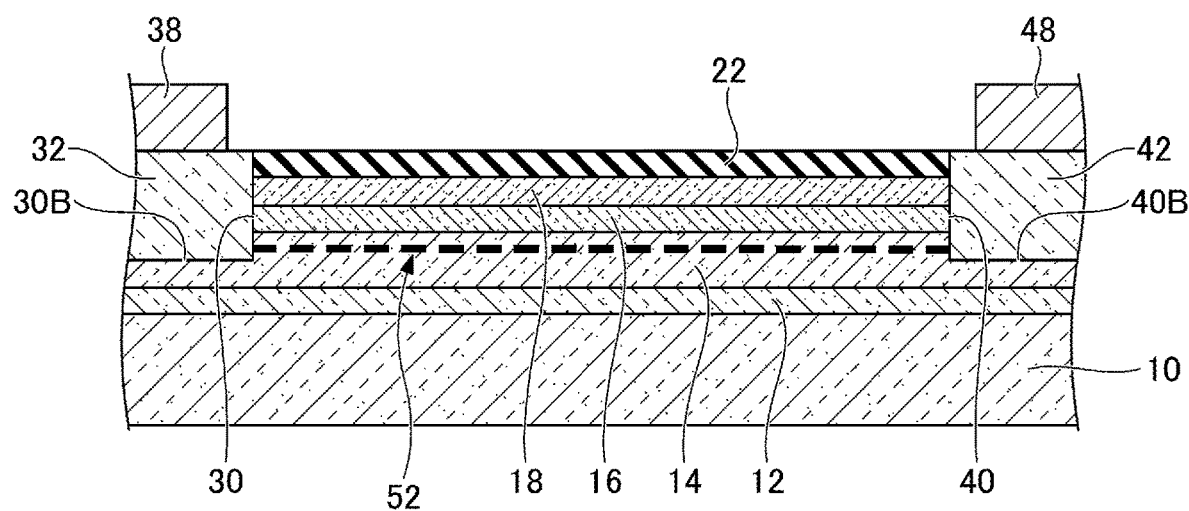
FIG. 8 is a cross-sectional view (eighth view) illustrating the method of manufacturing a semiconductor device according to the first embodiment.

Next, as illustrated in FIG. 8, the source electrode 38 is formed on the source region 32 and the drain electrode 48 is famed on the drain region 42. The source electrode 38 and the drain electrode 48 may be formed by, for example, vapor deposition, lift-off, or alloying heat treatment. The source electrode 38 and the drain electrode 48 include, for example, a Ta film and an Al film. The source electrode 38 and the drain electrode 48 are in ohmic contact with the 2DEG 52 via the source region 32 and the drain region 42, respectively.

Figure 9:
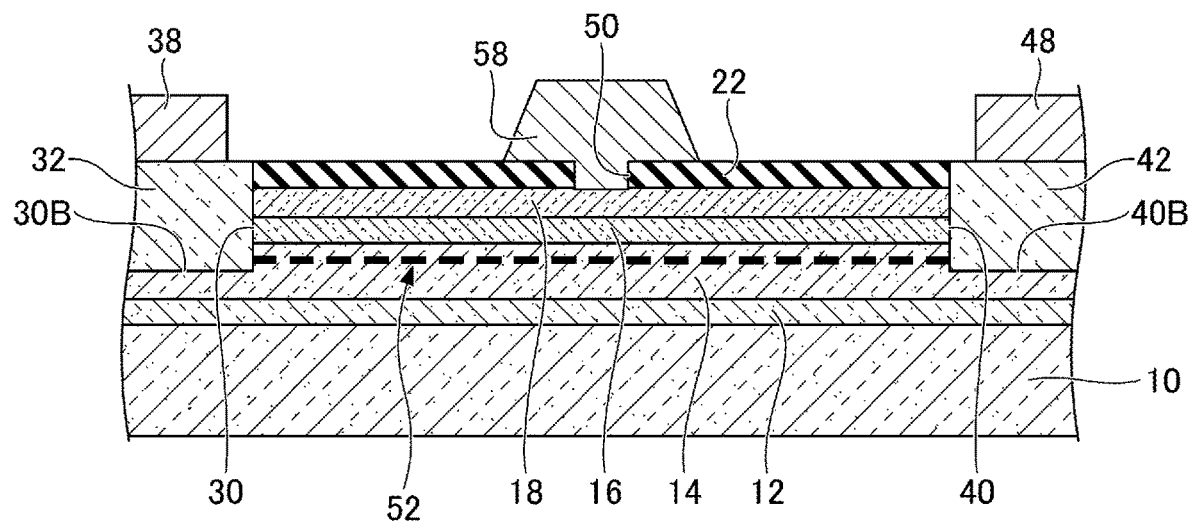
FIG. 9 is a cross-sectional view (ninth view) illustrating the method of manufacturing a semiconductor device according to the first embodiment.

Next, as illustrated in FIG. 9, a fifth opening 50 is formed in the protective film 22. When forming the fifth opening 50, for example, RIE is performed using an electron beam resist (not illustrated) as a mask. A reactive gas containing F is used for etching the protective film 22. Then, a gate electrode 58 is formed on the protective film 22. The gate electrode 58 may be famed by, for example, vapor deposition or lift-off. The gate electrode 58 includes, for example, a Ni film and an Au film. The gate electrode 58 makes a Schottky contact with the cap layer 18 via the fifth opening 50.

Figure 10:
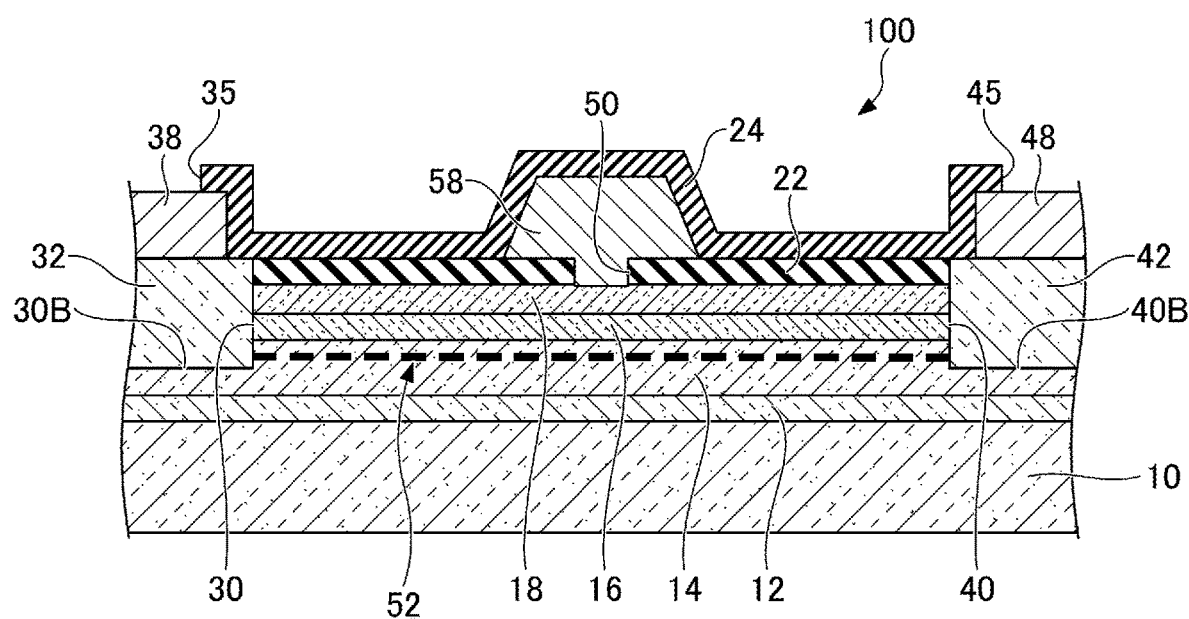
FIG. 10 is a cross-sectional view (tenth view) illustrating the method of manufacturing a semiconductor device according to the first embodiment.

Next, as illustrated in FIG. 10, an insulating film 24 covering the gate electrode 58, the source electrode 38, and the drain electrode 48 is formed. As the insulating film 24, for example, an aluminum oxide film or a silicon nitride film is formed. The aluminum oxide film may be formed by, for example, an ALD method. The silicon nitride film may be formed by, for example, a plasma CVD method. Then, an opening 35 for exposing a portion of the source electrode 38 and an opening 45 for exposing a portion of the drain electrode 48 are famed on the insulating film 24. When forming the opening 35 and the opening 45, for example, RIE is performed using a resist mask (not illustrated).

Then, wiring and the like is formed, as necessary. In this manner, a semiconductor device 100 including a GaN-HEMT can be manufactured.

In the first embodiment, because the source region 32 and the drain region 42 are famed separately from the electron transit layer 14 and the electron supply layer 16, the contact resistance can be reduced.

In addition, because the weakly acidic solution is used for the acid treatment, the sizes of the first gap 34 and the second gap 44 can be easily controlled. For example, instead of the weakly acidic solution, it is conceivable to use a strongly acidic solution such as that used for removing the ZnO film 72, for the acid treatment. However, when the strongly acidic solution is used, the etching of the ZnO film 72 progresses rapidly, so the sizes of the first gap 34 and the second gap 44 cannot be controlled. It is also conceivable to dilute the strongly acidic solution to reduce the solvency. For example, when hydrochloric acid having a concentration of 360 wtppm is used, the sizes of the first gap 34 and the second gap 44 may be controlled by time control of about 30 seconds to 60 seconds. However, it is not easy to keep the concentration of hydrochloric acid constant at 360 wtppm, even before the hydrochloric acid is used for the acid treatment. In addition, the concentration of ions in the hydrochloric acid supplied for the acid treatment easily changes as the etching progresses, resulting in a large change in solvency. Therefore, even when a low-concentration strongly acidic solution is used, it is difficult to control the sizes of the first gap 34 and the second gap 44.

In contrast, in the first embodiment, because the weakly acidic solution is used, the change in solvency is small even when etching has progressed. Therefore, it is easy to control the sizes of the first gap 34 and the second gap 44. For example, the sizes of the first gap 34 and the second gap 44 can be controlled based on etching time.

Because the sizes of the first gap 34 and the second gap 44 are easily controlled, the source region 32 and the drain region 42 can be formed with high accuracy, and stable electrical characteristics can be obtained.

The pH of the weakly acidic solution is preferably 3.0 or more and less than 7.0, more preferably 6.0 or more and less than 7.0, and even more preferably 6.5 or more and less than 7.0. When the pH of the weakly acidic solution is too low, the sizes of the first gap 34 and the second gap 44 may be difficult to control. It is particularly preferable that the pH of the weakly acidic solution is 6.86. Accordingly, the stability of the solvency is excellent.

It is preferable that the weakly acidic solution contains phosphoric acid. Accordingly, the pH does not change easily even when the etching of the ZnO film 72 has progressed. The weakly acidic solution may contain citric acid, bromic acid, and the like.

In the first embodiment, the third opening 30 and the fourth opening 40 are formed (see FIG. 3) prior to the acid treatment (see FIG. 5). Thus, the formation of the first opening 33 and the second opening 43 and the formation of the third opening 30 and the fourth opening 40 can be performed continuously in one processing chamber with the resist mask 80 left.

By forming the silicon nitride film as the protective film 22, it is easy to secure a large etching selectivity between the ZnO film 72 and the protective film 22. Further, by forming the aluminum oxide film as the sacrifice layer 74, it is easy to secure a large etching selectivity between the ZnO film 72 and the sacrifice layer 74.

The concentration of the n-type conductive impurity in each of the source region 32 and the drain region 42 is, for example, $5 \times 10^{18}$ cm$^{-3}$ or more and $2 \times 10^{19}$ cm$^{-3}$ or less, preferably $1 \times 10^{19}$ cm$^{-3}$ or more and $2 \times 10^{19}$ cm$^{-3}$ or less. Accordingly, the contact resistance of the source electrode 38 and the drain electrode 48 is easily reduced.

The concentration of the impurity in the source region 32 and the drain region 42 may be measured by secondary ion mass spectrometry (SIMS), for example.

The material of the source region 32 and the drain region 42 is not limited to GaN. The material of the semiconductor layer 60 may be AlGaN, AlN, InAlN, InAlGaN, or the like.

Second Embodiment

Next, a second embodiment will be described. The second embodiment differs from the first embodiment mainly in the order of forming the third opening 30 and the fourth opening 40 and the acid treatment. FIGS. 11 to 14 are cross-sectional views illustrating a method of manufacturing a semiconductor device according to the second embodiment.

Figure 11:
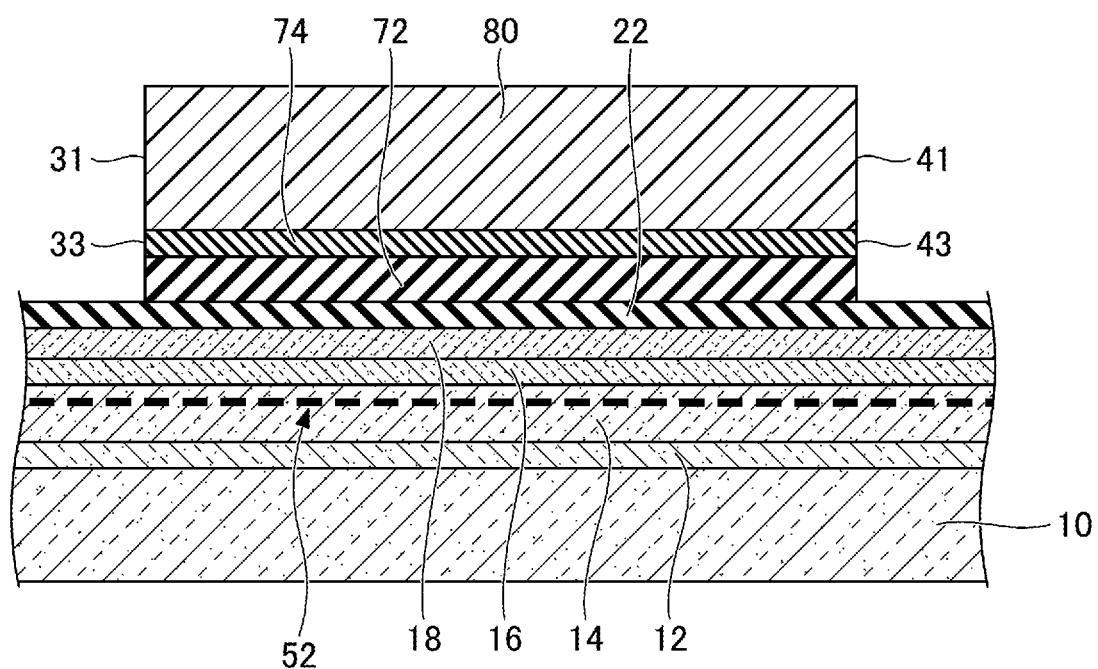
FIG. 11 is a cross-sectional view (first view) illustrating a method of manufacturing a semiconductor device according to a second embodiment.

First, in a manner similar to the first embodiment, the buffer layer 12, the electron transit layer 14, the electron supply layer 16, and the cap layer 18 (see FIG. 1), and the protective film 22, the ZnO film 72, and the sacrifice layer 74 (see FIG. 2) are formed. Then, as illustrated in FIG. 11, the resist mask 80 is famed on the sacrifice layer 74. The resist mask 80 includes the opening 31 for exposing a portion of the sacrifice layer 74 and the opening 41 for exposing another portion of the sacrifice layer 74. The opening 31 and the opening 41 may be famed by a process similar to that of the first embodiment.

Figure 12:
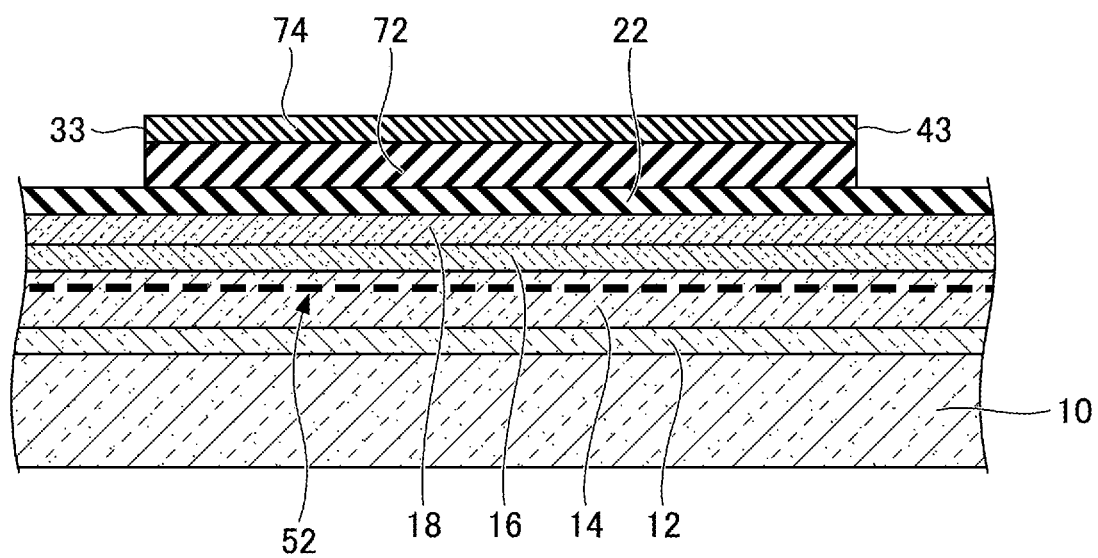
FIG. 12 is a cross-sectional view (second view) illustrating the method of manufacturing a semiconductor device according to the second embodiment.

Next, as illustrated in FIG. 12, the resist mask 80 is removed without etching the protective film 22 and the like. The resist mask 80 may be removed using, for example, an organic solvent.

Figure 13:
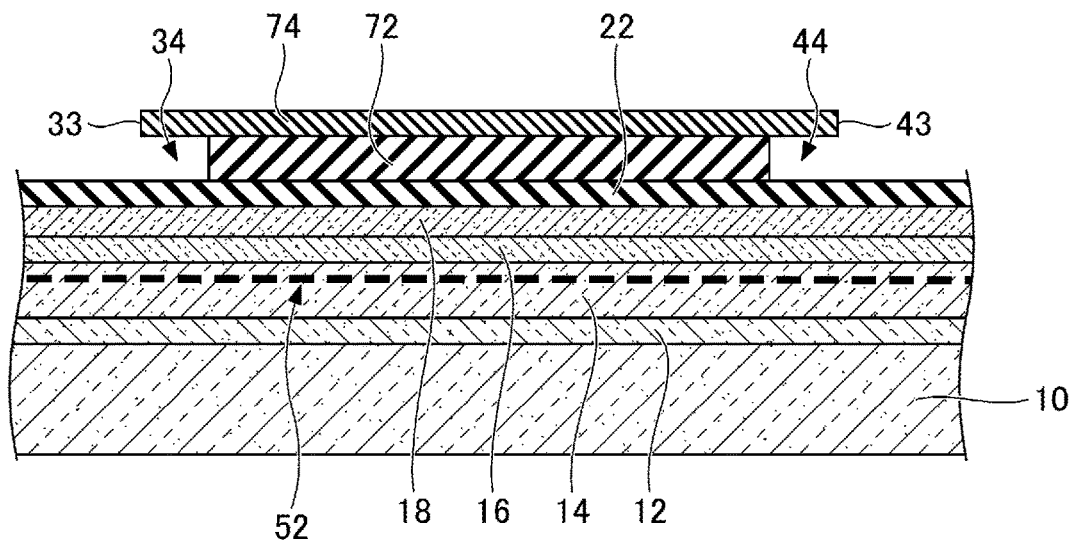
FIG. 13 is a cross-sectional view (third view) illustrating the method of manufacturing a semiconductor device according to the second embodiment.

Next, as illustrated in FIG. 13, by acid treatment using a weakly acidic solution, the first gap 34 is famed in the first portion exposed to the third opening 30 of the ZnO film 72, and the second gap 44 is famed in the second portion exposed to the fourth opening 40 of the ZnO film 72. The acid treatment may be performed in a manner similar to the first embodiment.

Figure 14:
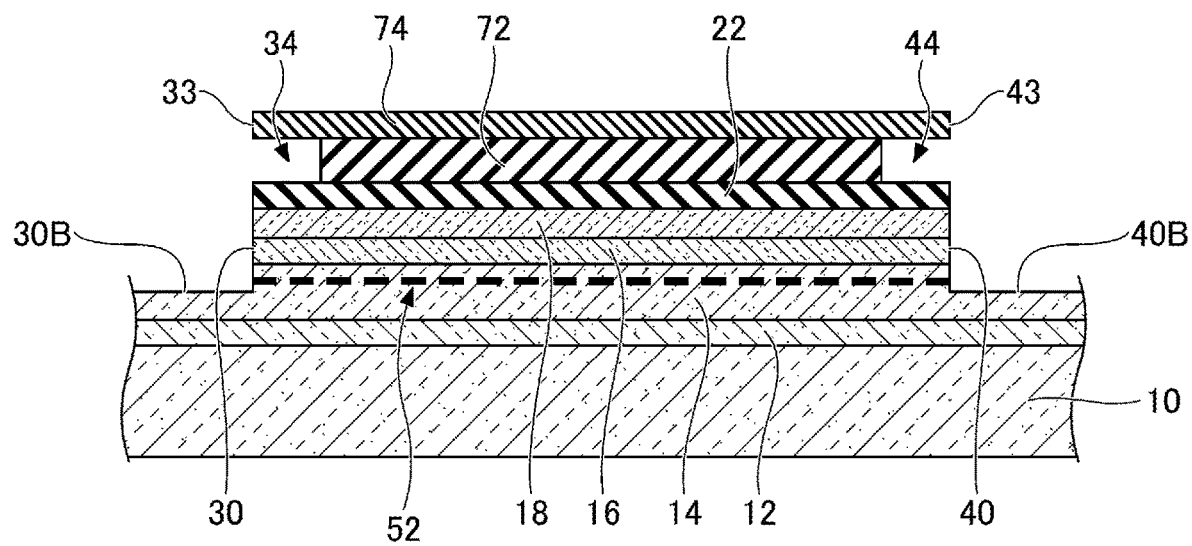
FIG. 14 is a cross-sectional view (fourth view) illustrating the method of manufacturing a semiconductor device according to the second embodiment.

Next, as illustrated in FIG. 14, the third opening 30 and the fourth opening 40 are famed in the protective film 22, the cap layer 18, the electron supply layer 16, and the electron transit layer 14. The third opening 30 and the fourth opening 40 may be formed by a process similar to that of the first embodiment.

Thereafter, processes after the formation of the semiconductor layer 60 are performed, in a manner similar to the first embodiment (see FIGS. 6 to 10). In this manner, a semiconductor device including a GaN-HEMT can be manufactured.

According to the second embodiment, similar to the first embodiment, the contact resistance can be reduced and stable electrical characteristics can be obtained.

In the second embodiment, the acid treatment is performed (see FIG. 13) prior to the formation of the third opening 30 and the fourth opening 40 (see FIG. 14). Thus, the electron supply layer 16 and the electron transit layer 14 are not exposed to the weakly acidic solution. Therefore, it is possible to prevent adhesion of substances (extraneous materials) contained in the weakly acidic solution to the electron supply layer 16 and the electron transit layer 14. For example, the weakly acidic solution may contain sodium hydroxide (NaOH) for pH adjustment and the like. When Na adheres to the electron supply layer 16 and the electron transit layer 14, the electrical characteristics of the semiconductor device may change. According to the present embodiment, it is possible to reduce variations in the electrical characteristics caused by the adhesion of such extraneous materials. The weakly acidic solution may contain ammonia for pH adjustment and the like.

While the embodiments have been described in detail above, it is to be understood that various modifications and changes are possible within the scope of the claims, and not limited to specific embodiments.

What is claimed is:

1. A method of manufacturing a semiconductor device comprising:
   forming an electron transit layer above a substrate;
   forming an electron supply layer above the electron transit layer;
   forming a protective film above the electron transit layer;
   forming a zinc oxide film above the protective film;
   forming a sacrifice layer above the zinc oxide film;
   forming a first opening and a second opening in the sacrifice layer and the zinc oxide film;
   forming a third opening connecting to the first opening and a fourth opening connecting to the second opening in the protective film, the electron supply layer, and the electron transit layer;
   forming, by acid treatment using a weakly acidic solution, a first gap in a first portion exposed to the first opening of the zinc oxide film, and a second gap in a second portion exposed to the second opening of the zinc oxide film;
   forming, after the acid treatment, a source region containing a first conductive impurity on a bottom surface of the third opening and a drain region containing the first conductive impurity on a bottom surface of the fourth opening; and
   removing the zinc oxide film after forming the source region and the drain region.

2. The method of manufacturing a semiconductor device according to claim 1, wherein pH of the weakly acidic solution is 3.0 or more and less than 7.0.

3. The method of manufacturing a semiconductor device according to claim 1, wherein pH of the weakly acidic solution is 6.86.

4. The method of manufacturing a semiconductor device according to claim 1, wherein the weakly acidic solution contains phosphoric acid.

5. The method of manufacturing a semiconductor device according to claim 1, wherein forming the third opening and the fourth opening are performed before the acid treatment.

6. The method of manufacturing a semiconductor device according to claim 1, wherein the acid treatment is performed before forming the third opening and the fourth opening.

7. The method of manufacturing a semiconductor device according to claim 6, wherein the weakly acidic solution contains sodium hydroxide.

8. The method of manufacturing a semiconductor device according to claim 1, wherein a silicon nitride film is formed as the protective film.

9. The method of manufacturing a semiconductor device according to claim 1, wherein an aluminum oxide film or a silicon nitride film is famed as the sacrifice layer.

10. The method of manufacturing a semiconductor device according to claim 1, wherein a concentration of the first conductive impurity in each of the source region and the drain region is $5 \times 10^{18}$ cm$^{-3}$ or more and $2 \times 10^{19}$ cm$^{-3}$ or less.

* * * * *